(12) United States Patent
Avramescu et al.

(10) Patent No.: US 8,711,893 B2
(45) Date of Patent: Apr. 29, 2014

(54) OPTOELECTRONIC COMPONENT AND METHOD FOR PRODUCING AN OPTOELECTRONIC COMPONENT

(75) Inventors: Adrian Stefan Avramescu, Regensburg (DE); Christoph Eichler, Tegernheim (DE); Uwe Strauss, Bad Abbach (DE); Volker Haerle, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 554 days.

(21) Appl. No.: 12/920,312

(22) PCT Filed: Jan. 28, 2009

(86) PCT No.: PCT/DE2009/000116
§ 371 (c)(1),
(2), (4) Date: Nov. 5, 2010

(87) PCT Pub. No.: WO2009/106028
PCT Pub. Date: Sep. 3, 2009

(65) Prior Publication Data
US 2011/0051771 A1    Mar. 3, 2011

(30) Foreign Application Priority Data

Feb. 29, 2008  (DE) .......................... 10 2008 011 864
Apr. 17, 2008  (DE) .......................... 10 2008 019 268

(51) Int. Cl.
*H01S 5/00* (2006.01)

(52) U.S. Cl.
USPC ...................................... 372/50.11; 372/50.1

(58) Field of Classification Search
USPC ........ 372/43.01, 50.11, 92; 327/43.01, 50.11, 327/92
See application file for complete search history.

(56) References Cited

U.S. PATENT DOCUMENTS

| | | | |
|---|---|---|---|
| 4,605,942 A * | 8/1986 | Camlibel et al. ................ | 257/89 |
| 5,374,564 A | 12/1994 | Bruel | |
| 6,280,523 B1 | 8/2001 | Coman et al. | |
| 6,559,075 B1 | 5/2003 | Kelly et al. | |
| 6,649,440 B1 | 11/2003 | Krames et al. | |
| 7,524,737 B2 | 4/2009 | Brüderl et al. | |
| 7,859,007 B2 | 12/2010 | Hirayama et al. | |
| 2002/0030198 A1 | 3/2002 | Coman et al. | |
| 2003/0160257 A1 | 8/2003 | Bader et al. | |
| 2005/0040414 A1* | 2/2005 | Hirayama et al. .............. | 257/97 |
| 2006/0094145 A1* | 5/2006 | Otsuka et al. ................... | 438/31 |
| 2006/0273324 A1 | 12/2006 | Asai et al. | |
| 2007/0057337 A1* | 3/2007 | Kano et al. ..................... | 257/431 |
| 2007/0099321 A1 | 5/2007 | Miyachi et al. | |
| 2007/0121690 A1* | 5/2007 | Fujii et al. .................. | 372/43.01 |
| 2009/0090900 A1 | 4/2009 | Avramescu et al. | |

(Continued)

FOREIGN PATENT DOCUMENTS

DE   199 05 517   12/1999
DE   199 53 588    8/2000

(Continued)

*Primary Examiner* — Armando Rodriguez
(74) *Attorney, Agent, or Firm* — Cozen O'Connor (57) ABSTRACT

An optoelectronic component contains an epitaxial layer sequence based on a nitride compound semiconductor having an active layer and an epitaxial growth substrate comprising $Al_{1-x}Ga_xN$, where $0<x<0.95$. In a method for producing an optoelectronic component an epitaxial growth substrate of $Al_{1-x}(In_yGa_{1-y})_xN$ or $In_{1-x}Ga_xN$, where $0<x<0.99$ and $0\leq y\leq 1$, is provided and an epitaxial layer sequence, which is based on a nitride compound semiconductor and contains an active layer, is grown thereon.

4 Claims, 8 Drawing Sheets

(56) References Cited

U.S. PATENT DOCUMENTS

| | | |
|---|---|---|
| 2009/0117711 A1 | 5/2009 | Harle et al. |
| 2009/0309113 A1 | 12/2009 | Eichler et al. |
| 2011/0201142 A1 | 8/2011 | Hirayama et al. |

FOREIGN PATENT DOCUMENTS

| | | |
|---|---|---|
| DE | 199 53 609 | 8/2000 |
| DE | 100 17 757 | 12/2000 |
| DE | 11 2004 001 401 | 6/2006 |
| DE | 10 2005 035 722 | 2/2007 |
| DE | 10 2005 052 358 | 3/2007 |
| DE | 10 2006 023685 | 4/2007 |
| DE | 10 2006 061 167 | 12/2007 |
| EP | 1 387 414 | 2/2004 |
| EP | 1 508 923 | 2/2005 |
| EP | 1 675 189 | 6/2006 |
| JP | 2003-273399 | 9/2003 |
| JP | 2005-101533 | 4/2005 |
| JP | 2007-080896 | 3/2007 |
| JP | 2007-521641 | 8/2007 |
| TW | 2005 09422 | 3/2005 |
| WO | WO 98/14986 | 4/1998 |
| WO | WO 2005/055383 | 6/2005 |
| WO | WO 2005/064666 | 7/2005 |
| WO | WO 2007/105882 | 9/2007 |

* cited by examiner

OPTOELECTRONIC COMPONENT AND METHOD FOR PRODUCING AN OPTOELECTRONIC COMPONENT

RELATED APPLICATIONS

This is a U.S. national stage of application No. PCT/DE2009/000116, filed on Jan. 28, 2009.

This application claims the priority of German application no. 10 2008 011 864.8 filed Feb. 29, 2008 and 10 2008 019 268.6 filed Apr. 17, 2008, the entire contents of both of which are hereby incorporated by reference.

FIELD OF THE INVENTION

The invention relates to an optoelectronic component and a method for the production thereof.

BACKGROUND OF THE INVENTION

In the case of optoelectronic semiconductor components, for example semiconductor lasers or LEDs, the service life of the component is correlated inter alia with the number of defects in the epitaxially grown semiconductor layers. The internal quantum efficiency is also reduced by a high number of defects, whereby the luminous efficiency is reduced. A high quality epitaxial growth substrate is required for the epitaxial growth of semiconductor layers with a low defect density.

In order to produce optoelectronic components based on nitride compound semiconductors, it is difficult to provide suitable epitaxial growth substrates which have a lattice constant suitable for the epitaxial growth of nitride compound semiconductors and which are simultaneously distinguished by a low defect density at their surface.

It is known to grow epitaxial semiconductor layers consisting of nitride compound semiconductors on SiC or sapphire substrates. However, when growing on such epitaxial growth substrates, a comparatively large amount of defects are produced at the interface between the epitaxial growth substrate and the epitaxial semiconductor layers, which defects extend from the epitaxial growth substrate through the component and are thus referred to as "threading dislocations". The defects typically have a surface density (threading dislocation density (TDD)) of typically more than $10^8$ cm$^{-2}$.

Meanwhile, although substrates consisting of GaN having a comparatively low defect density of typically more than $10^5$ cm$^{-2}$ are available for the epitaxial growth of nitride compound semiconductors, the high price of such GaN substrates impede the commercial use in the mass production of optoelectronic components based on nitride compound semiconductors.

A further disadvantage in the use of GaN substrates resides in the fact that the epitaxial layers of the optoelectronic component cannot be readily separated from the epitaxial growth substrate in order to produce so-called thin-film components. Such thin-film components can be produced on a sapphire substrate after the growth of the epitaxial layer sequence for example by means of a laser lift off process. In the laser lift off process, laser radiation is radiated through the transparent epitaxial growth substrate and is absorbed at the interface between the epitaxial growth substrate and the epitaxial layer sequence, wherein the absorption of the laser radiation produces material decomposition at the interface which results in the separation of the epitaxial growth substrate. Such a laser lift off method is known for example from publication WO 98/14986. However, in contrast to substrates consisting of sapphire, generally this method cannot readily be applied to substrates consisting of GaN since the GaN epitaxial growth substrate is not transparent.

SUMMARY OF THE INVENTION

One object of the invention is to provide an optoelectronic component which is distinguished by a low defect density and a comparatively low production cost. Another object of the invention is to provide a method for producing an optoelectronic component, by means of which a low defect density with low production costs is achieved. In particular, the option of separating the epitaxial growth substrate from the epitaxial layer sequence by means of a laser lift off method is to be made available.

These and other objects are attained in accordance with one aspect of the present invention directed to an optoelectronic component according to the invention, which contains an epitaxial layer sequence based on a nitride compound semiconductor having an active layer, comprises an epitaxial growth substrate of $Al_{1-x}(In_yGa_{1-y})_xN$ or $In_{1-x}Ga_xN$, where 0<x<0.99 and 0≤y≤1. Preferably, x<0.95.

The epitaxial layer sequence is epitaxially grown on the epitaxial growth substrate so that its lattice constant in a direction parallel to the layer plane (in-plane lattice constant), is preferably substantially determined by the in-plane lattice constant of the epitaxial growth substrate.

Such an epitaxial growth substrate of $Al_{1-x}(In_yGa_{1-y})_xN$ or $In_{1-x}Ga_xN$, where 0<x<0.99 and 0≤y≤1, can be produced in a comparatively simple manner as bulk material by a crystal growth method and is thus comparatively favourable in terms of cost. This is based in particular on the fact that the binding forces of the atoms at the surface of these ternary and quaternary nitride compound semiconductors are stronger than the binding forces at the surface of pure GaN. The comparatively stable crystal surface favours crystal growth, in particular the production of single crystals. Furthermore, such an epitaxial growth substrate is advantageously distinguished by the intrinsic properties of the bulk material. The defect density (Threading Dislocation Density, TDD) of the epitaxial growth substrate is advantageously less than $10^7$ cm$^{-2}$, particularly preferably less than $10^6$ cm$^{-2}$.

The low defect density of the epitaxial growth substrate has a positive effect on the crystal quality of the epitaxial layer sequence. As a result, the service life of the optoelectronic component, in particular in high-performance components such as semiconductor lasers, and the quantum efficiency in radiation generation are advantageously increased.

The epitaxial growth substrate can be a self-supporting substrate. However, in an alternative manner, the epitaxial growth substrate can also be a so-called quasi-substrate.

In terms of this application, a "quasi-substrate" is understood to mean a thin layer which has previously been separated from a semiconductor substrate consisting of the respective semiconductor material and has been transferred to another support.

Such a method for transferring a thin layer of a semiconductor substrate to another support is known per se from publication U.S. Pat. No. 5,374,564. In this case, ions are implanted through a surface of the semiconductor substrate and in this manner an ion implantation zone is produced in the semiconductor substrate. Then, the substrate is attached to this surface, for example by means of an intermediate layer, such as in particular a solder layer, on the support. Subsequently, the semiconductor substrate is separated along the ion implantation zone by means of tempering so that a thin layer of the original semiconductor substrate remains on the support and can be used as the epitaxial growth substrate, e.g., for the epitaxial growth of an epitaxial layer sequence of an optoelectronic component.

The thin layer on the support acting as the epitaxial growth substrate is particularly characterized in that its in-plane lattice constant is substantially determined by the composition of the semiconductor material and is thus not influenced, or is only influenced to an insignificant degree, by the support. It therefore differs from a thin epitaxially grown layer whose in-plane lattice constant is substantially determined by the epitaxial growth substrate. In contrast to a layer transferred onto the support, in the case of an epitaxially grown layer, the lattice constant was adapted to a lattice constant corresponding to the material composition only in the case of the large layer thicknesses by the formation of defects.

The epitaxial layer sequence of the optoelectronic component is based on a nitride compound semiconductor. In the present context, "based on a nitride compound semiconductor" means that the epitaxial layer sequence or at least the active layer includes a nitride III/V compound semiconductor material, preferably $Al_nGa_mIn_{1-n-m}N$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

The active layer can be in particular a radiation-emitting active layer. The active layer can be formed for example as a pn junction, a double heterostructure, a single quantum well structure or a multiple quantum well structure. The term quantum well structure includes any structure in which charge carriers experience quantization of their energy states by way of confinement. In particular, the term quantum well structure contains no indications as to the dimensionality of the quantisation. It thus includes inter alia quantum wells, quantum wires and quantum dots and any combination of these structures.

In an advantageous embodiment, at least one buffer layer is disposed on the epitaxial growth substrate. By means of the buffer layer disposed between the epitaxial growth substrate and the epitaxial layer sequence of the optoelectronic component, in an advantageous manner a step-like or gradient-like transition of the lattice constant from the epitaxial growth substrate to the epitaxial layer sequence is achieved, whereby mechanical stresses are advantageously reduced. Preferably, several buffer layers are applied onto the epitaxial growth substrate so that the lattice constant in the buffer layer sequence varies in a stepped manner or in the form of a gradient.

In a particularly preferred manner, several buffer layers of $In_yAl_xGa_{1-x-y}N$, where $x<0.9$ and $y<0.1$ are disposed between the epitaxial growth substrate and the epitaxial layer sequence. The difference in the lattice constants between the adjacent buffer layers is in each case preferably kept small so that no additional defects are produced by way of mechanical tensions. The epitaxial layer sequence of the optoelectronic component can, as a result, be advantageously grown on the uppermost buffer layer which is advantageously distinguished by a good lattice adaptation to the epitaxial layers and a low defect density.

In one embodiment the epitaxial layer sequence includes a Distributed Bragg Reflector, wherein the Distributed Bragg Reflector comprises several layer pairs which each contain a first layer of $In_{y1}Al_{x1}Ga_{1-x1-y1}N$ and a second layer of $In_{y2}Al_{x2}Ga_{1-x2-y2}N$, wherein for the aluminium content $x1>0.01$ and $x2>0.05$.

An epitaxial growth substrate of $Al_{1-x}(In_yGa_{1-y})_xN$, where $0<x<0.99$ and $0 \leq y \leq 1$, is advantageous in that the layer pairs of the Distributed Bragg Reflector can have a higher aluminium concentration in contrast to a pure GaN epitaxial growth substrate with an identical lattice mismatch. By way of a different aluminium content $x1 \neq x2$ in the alternating layers of the Distributed Bragg Reflector, in particular with $x1>0.01$ and $x2>0.05$, the refractive index contrast in the Distributed Bragg Reflector is increased, whereby the reflectivity is advantageously increased. This is particularly advantageous in that in contrast to a Distributed Bragg Reflector with a low aluminium content in the layers, the same or even a higher reflectivity can be achieved with a lower number of layer pairs. A lower number of layer pairs in the Distributed Bragg Reflector is advantageous in that the production cost is reduced and the heat dissipation from the epitaxial layer system is improved owing to the lower total thickness.

The Distributed Bragg Reflector is advantageously disposed between the epitaxial growth substrate and the active layer. This is advantageous for an optoelectronic component in which the radiation emitted by the active layer is emitted through the surface opposite the epitaxial growth substrate. In this example, the Distributed Bragg Reflector reflects the radiation, emitted in the direction of the epitaxial growth substrate, to the radiation exit surface opposite the epitaxial growth substrate. Furthermore, the Distributed Bragg Reflector can form a resonator mirror of a surface-emitting semiconductor laser.

The optoelectronic component can be a surface-emitting optoelectronic component, i.e., in particular a surface-emitting semiconductor laser having a vertical resonator (Vertical Cavity Surface-Emitting Laser, VCSEL), a surface-emitting semiconductor laser with an external vertical resonator (Vertical External Cavity Surface-Emitting Laser, VECSEL) or an LED, in particular an LED having a resonant cavity (Resonant Cavity LED, RCLED).

Furthermore, the optoelectronic component can be an edge-emitting semiconductor laser. In the case of the edge-emitting semiconductor laser, the active layer is preferably disposed between two waveguide layers which form a waveguide in which the radiation emitted from the active layer can propagate in the main emission direction. In the case of a conventional edge-emitting semiconductor laser, on both sides of the active layer respective cladding layers adjoin the waveguide layers and have a lower refractive index than the waveguide layers so that the refractive index jump causes the wave to be guided optically in the waveguide.

Since the epitaxial growth substrate and/or the buffer layers in the optoelectronic component have a comparatively low refractive index, owing to their aluminium content, the cladding layer which faces the epitaxial growth substrate as seen from the active layer can be obviated in an advantageous manner. Therefore, preferably a cladding layer follows only the waveguide layer opposite the epitaxial growth substrate as seen from the active layer and no cladding layer is disposed between the epitaxial growth substrate and the waveguide layer facing the epitaxial growth substrate. As a result, the production cost is advantageously reduced and the heat dissipation in the direction of the epitaxial growth substrate is improved owing to the low total layer thickness of the epitaxial layer sequence.

For the heat dissipation of the heat produced during operation of the optoelectronic component, the epitaxial growth substrate is preferably mounted on a heat sink on the side remote from the active layer. The heat sink can be a passive heat sink, e.g., a copper block, or an active heat sink, e.g., a microchannel cooler. In this case it is advantageous that the epitaxial growth substrate of $Al_{1-x}(In_yGa_{1-y})_xN$ or $In_{1-x}Ga_xN$, where $0<x<0.99$ and $0\leq y\leq 1$, has an improved thermal conductivity in comparison with the conventionally used substrates consisting of sapphire or GaN. Thus, the heat produced in the active layer can be efficiently dissipated to the heat sink via the epitaxial growth substrate.

Another aspect of the invention is directed to a method for producing an optoelectronic component, wherein an epitaxial growth substrate of $Al_{1-x}(In_yGa_{1-y})_xN$ or $In_{1-x}Ga_xN$, where $0<x<0.99$ and $0\leq y\leq 1$ is provided and subsequently an epitaxial layer sequence which is based on a nitride compound semiconductor and comprises an active layer is grown on the epitaxial growth substrate.

Preferably, prior to the epitaxial growth of the epitaxial layer sequence, at least one buffer layer is grown on the epitaxial growth substrate. In an advantageous manner, several buffer layers of $In_yAl_xGa_{1-x-y}N$, where $x<0.9$ and $y<0.1$ are applied to the epitaxial growth substrate.

In a further advantageous embodiment, prior to the epitaxial growth of the epitaxial layer sequence or optionally of the one or several buffer layers, heat treatment of the epitaxial growth substrate is effected. By means of the heat treatment, oxides and carbon compounds can be advantageously removed from the surface of the epitaxial growth substrate. The heat treatment is advantageously effected at a temperature of more than 1000° C., preferably at a temperature between 1000° C. and 1100° C. The heat treatment is preferably effected in situ, i.e., in the high vacuum chamber provided for the epitaxial growth of the epitaxial layer sequence. The heat treatment is preferably effected with the supply of $H_2$ gas or $NH_3$ gas.

In one preferred embodiment of the method according to the invention, the epitaxial growth substrate is cut off after the epitaxial growth of the epitaxial layer sequence.

The epitaxial growth substrate is advantageously separated from the epitaxial layer sequence by means of a laser lift off method. The laser lift off method can be used in particular when the epitaxial growth substrate is transparent for radiation which is absorbed by the epitaxial layer sequence which means that the laser radiation can be radiated through the substrate into the epitaxial layers. This method can thus be used in particular in an epitaxial growth substrate of $Al_{1-x}(In_yGa_{1-y})_xN$, where $x<0.99$ in contrast to GaN substrates since the epitaxial growth substrate has a larger electronic band gap than GaN, owing to the aluminium content. The aluminium content of the epitaxial growth substrate is advantageously selected such that the epitaxial growth substrate is transparent for radiation which is absorbed by the epitaxial layer sequence.

An alternative option for separating the epitaxial growth substrate from the epitaxial layer sequence resides in the fact that prior to the epitaxial growth of the epitaxial layer sequence a sacrificial layer is applied to the epitaxial growth substrate, wherein the epitaxial growth substrate is subsequently removed by selectively etching the sacrificial layer.

Prior to separating the epitaxial growth substrate, the epitaxial layer sequence is preferably connected to a support at the surface opposite the epitaxial growth substrate. Separating the epitaxial growth substrate from the epitaxial layer sequence and connecting the epitaxial layer sequence to another support is advantageous in that the support does not have to be adapted to the epitaxial growth of a nitride compound semiconductor. A large number of suitable materials are thus available for the support. The support can particularly consist of a material which is distinguished by an efficient electric and/or thermal conductivity and/or by low costs. For example, the support can be formed from Ge, GaAs, Si, SiC, a metal such as for example Mo or Au, a metal alloy, or ceramic such as for example AlN.

In this case, it is advantageous if prior to connecting the epitaxial layer sequence to the support a reflection-increasing layer or layer sequence is applied to the surface of the epitaxial layer sequence remote from the epitaxial growth substrate. This is advantageous if the optoelectronic component is an LED in which radiation is emitted by the surface which is opposite the support and from which the epitaxial growth substrate is cut off. The support having the reflection-increasing layer advantageously reflects radiation, which is emitted in the direction of the support, to the radiation exit side which means that absorption in the support is reduced.

The epitaxial layer sequence is preferably grown on the epitaxial growth substrate such that firstly a region of n-doped semiconductor layers is grown and subsequently a region of p-doped semiconductor layers is grown, wherein the active layer is disposed between the region of n-doped semiconductor layers and the region of p-doped semiconductor layers. If the epitaxial growth substrate is cut off after the epitaxial growth of the epitaxial layer sequence, in contrast to conventional optoelectronic components, the region of n-doped semiconductor layers is thus accessible for structuring.

Structuring is preferably effected in the region of the n-doped semiconductor layers after separation of the epitaxial growth substrate. For example, the optoelectronic component can be an LED in which radiation is emitted through the surface on which the epitaxial growth substrate was originally disposed. In an advantageous manner, a structure is produced on this surface free of the epitaxial growth substrate and improves the coupling out of radiation from the semiconductor material. The structure can be in particular surface wrinkling or a prismatic structure.

The accessibility of the region of n-doped semiconductor layers of the epitaxial layer sequence for structuring is also particularly advantageous if the optoelectronic component is a semiconductor laser. For example, the region of the n-doped semiconductor layers can be structured to form a ridge waveguide, wherein the ridge waveguide laser is preferably mounted on a support over the entire surface on the side of the p-doped semiconductor layers.

In comparison with conventional optoelectronic components in which the region of p-doped semiconductor layers is generally structured, the structuring of the n-doped semiconductor layers is advantageous in that a larger number of suitable plasma processes are available for implementing the structuring. It has emerged that in the case of structuring of p-doped semiconductor layers there is a risk for a few plasma processes that the electrical properties of the layers degrade during implementation of the plasma process. In contrast thereto, the region of the n-doped semiconductor layers is less sensitive which means that the risk of degradation of the electrical properties is reduced.

Separating the epitaxial growth substrate from the epitaxial layer sequence is also advantageous if the optoelectronic component is an edge-emitting semiconductor laser. In this case, after separation of the epitaxial growth substrate, side facets, which form the resonator reflector of the edge-emitting semiconductor laser, can be produced in the epitaxial layer sequence in a comparatively simple manner by scribing and cleaving the epitaxial layer sequence. The production cost for producing the reflective side facets is thus advantageously low.

DETAILED DESCRIPTION OF THE DRAWINGS

Identical components, or components which act in an identical manner, are provided with the same reference numerals in each case. The illustrated components and the size ratios of the components with respect to each other are not to be regarded as being true to scale.

Figure 1:
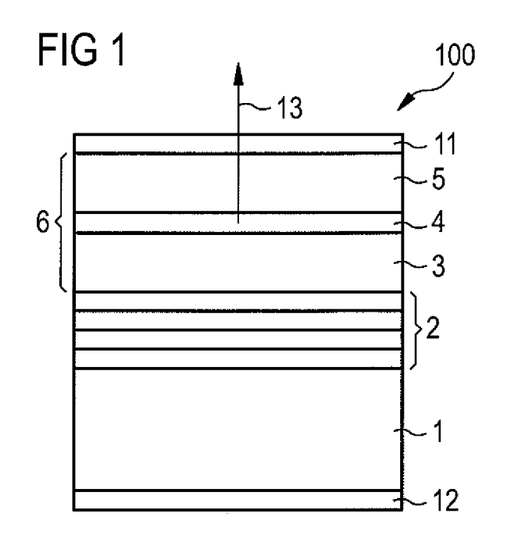
FIG. 1 shows a schematic illustration of a cross-section through an optoelectronic component according to a first exemplary embodiment according to the invention.

The optoelectronic component in the exemplary embodiment illustrated in FIG. 1 is an LED 100. The LED 100 comprises an epitaxial growth substrate 1 of $Al_{1-x}(In_yGa_{1-y})_xN$ or $In_{1-x}Ga_xN$, where $0<x<0.99$ and $0\leq y\leq 1$.

In an advantageous manner, several buffer layers 2 which comprise $In_yAl_xGa_{1-x-y}N$ are applied to the epitaxial growth substrate 1. Preferably, $x<0.9$ and $y<0.1$.

An epitaxial layer sequence 6 is applied to the buffer layers 2. The epitaxial layer sequence 6 includes an n-doped region 3, which contains one or several semiconductor layers, and a p-doped region 5, which contains one or several semiconductor layers. An active layer 4 is disposed between the n-doped region 3 and the p-doped region 5.

The layers of the epitaxial layer sequence 6, in particular the active layer 4 contained therein, are based on a nitride compound semiconductor.

The active layer 4 is a layer emitting radiation 13, wherein the emitted radiation 13 is preferably radiation from the ultraviolet or from the blue or green visible spectral range. The active layer 4 can not only be an individual layer but it can also include several partial layers, in particular a single or multiple quantum well structure.

A p-contact layer 11 is applied to the epitaxial layer sequence 6 for electrically contacting the LED 100. For example, an n-contact layer 12 can be applied to the rear side of the epitaxial growth substrate 1.

The epitaxial growth substrate 1, which is contained in the LED 100 and consists of $Al_{1-x}(In_yGa_{1-y})_xN$ or $In_{1-x}Ga_xN$, where $0<x<0.99$ and $0\leq y\leq 1$ is advantageously distinguished by a low defect density of preferably less than $1\times 10^7$ cm$^{-2}$, in a particularly preferred manner less than $1\times 10^6$ cm$^{-2}$. Good lattice match to the epitaxial layer sequence 6 can be achieved by the buffer layer sequence inserted between the epitaxial growth substrate 1 and the epitaxial layer sequence 6. The compositions of the buffer layers 2 vary for this purpose preferably in a stepped manner or in the form of a gradient so that as few mechanical tensions and defects associated therewith as possible are produced by the epitaxial growth of the buffer layer sequence 2. Furthermore, the epitaxial growth substrate 1 is advantageous in that it can be produced in a comparatively cost-favourable manner compared with GaN substrates.

When producing the LED 100, the epitaxial growth substrate is preferably heat treated prior to the epitaxial growth of the buffer layer sequence 2 on the epitaxial growth substrate 1. The heat treatment can advantageously be effected in situ, i.e., in the coating chamber provided for the epitaxial growth of the subsequent layers. The heat treatment is preferably effected at a temperature of more than 1000° C., in a particularly preferred manner at a temperature between 1000° C. and 1100° C. By means of the heat treatment, which is preferably effected with the supply of $H_2$ gas or $NH_3$ gas, impurities such as oxides or carbon compounds can be advantageously removed from the surface of the substrate.

Figure 2:
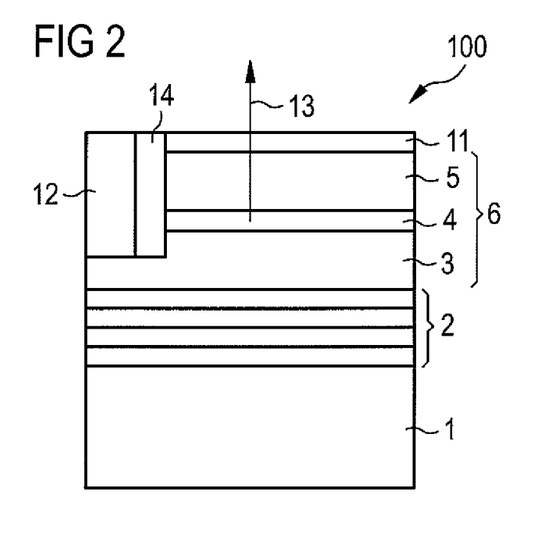
FIG. 2 shows a schematic illustration of a cross-section through an optoelectronic component according to a second exemplary embodiment of the invention.

The exemplary embodiment of an LED 100 illustrated in FIG. 2 differs from the exemplary embodiment illustrated in FIG. 1 by virtue of the fact that the n-contact layer 12 is not disposed on the rear side of the epitaxial growth substrate 1 but is rather disposed, like the p-contact layer 11 on the side of the LED 100 opposite the epitaxial growth substrate 1. In order to produce the n-contact, the epitaxial layer sequence 6 is etched down preferably in a boundary region of the LED 100 to the n-doped region 3 in order to provide the n-doped region 3 with the n-contact layer 12. The active layer 4 and the p-doped region 5 are in this case insulated from the n-contact layer 12 by means of an electrically insulating passivation layer 14 which is applied in particular to the exposed side flank of the epitaxial layer sequence 6. This type of electrically contacting is particularly advantageous when the epitaxial growth substrate 1 is not electrically conductive. An alternative option for electrically contacting the LED 100 in the case of an electrically non-conductive epitaxial growth substrate resides in the fact that feedthroughs are guided from the rear side of the epitaxial growth substrate 1 through the epitaxial growth substrate 1 to the at least one n-doped region 3 (not illustrated).

Figure 3:
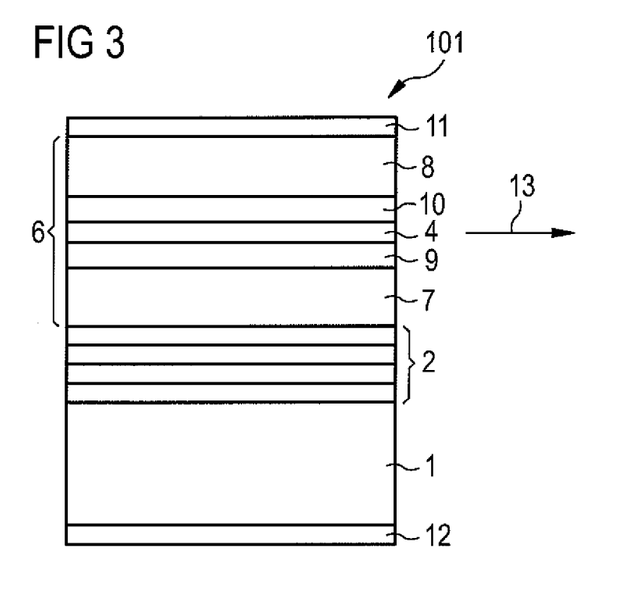
FIG. 3 shows a schematic illustration of a cross-section through an optoelectronic component according to a third exemplary embodiment of the invention.

The optoelectronic component in the exemplary embodiment illustrated in FIG. 3 is an edge-emitting semiconductor laser 101. Like the LEDs in the previous exemplary embodiments, the edge-emitting semiconductor laser 101 is grown on an epitaxial growth substrate 1 of $Al_{1-x}(In_yGa_{1-y})_xN$ or $In_{1-x}Ga_xN$, where $0<x<0.99$ and $0\leq y\leq 1$. Several buffer layers 2 which preferably include several layers of $In_yAl_xGa_{1-x-y}N$, where $x<0.9$ and $y<0.1$, are disposed between the epitaxial growth substrate 1 and the epitaxial layer sequence 6 of the edge-emitting semiconductor laser 101. Electrically contacting the edge-emitting semiconductor laser is effected for example by means of a p-contact layer 11 applied to the epitaxial layer sequence 6 and an n-contact layer 12 disposed on the rear side of the epitaxial growth substrate 1.

The epitaxial layer sequence 6 of the edge-emitting semiconductor laser contains an active layer 4 which is disposed between a first waveguide layer 9 and a second waveguide layer 10. On the sides remote from the active layer 4, a first cladding layer 7 adjoins the first waveguide layer 9 and a second cladding layer 8 adjoins the second waveguide layer 10.

Preferably, the first cladding layer 7 facing the epitaxial growth substrate 1 and the first waveguide layer 9 are n-doped, and the first waveguide layer 10, disposed above the active layer 4 as seen from the epitaxial growth substrate 1, and the second cladding layer 8 are p-doped. The cladding layers 7, 8 are distinguished by a lower refractive index than the waveguide layers 9, 10 and are effective such that the laser radiation 13, which propagates in the lateral direction, is guided in the waveguide layers 9, 10.

The epitaxial growth substrate 1 has the advantage of a lower defect density, whereby in particular the long-term stability of the edge-emitting semiconductor laser 101 is improved. Furthermore, the production costs are comparatively low compared with the use of a GaN epitaxial growth substrate.

Figure 4:
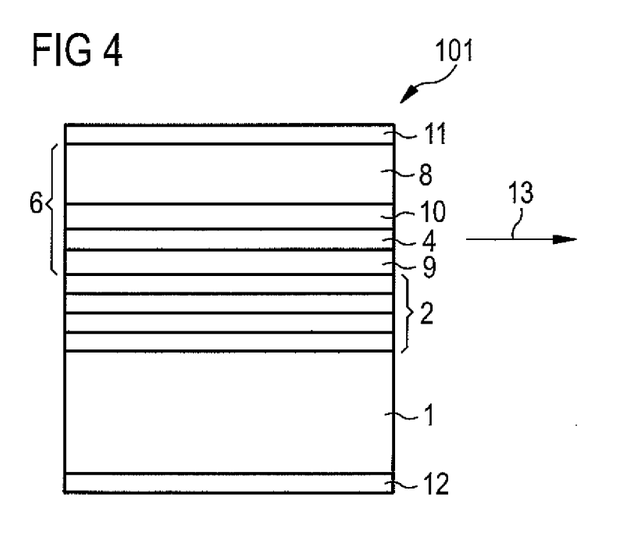
FIG. 4 shows a schematic illustration of a cross-section through an optoelectronic component according to a fourth exemplary embodiment of the invention.

A further exemplary embodiment of an edge-emitting semiconductor laser 101 is illustrated in FIG. 4. This exemplary embodiment differs from the exemplary embodiment illustrated in FIG. 3 by virtue of the fact that the epitaxial layer sequence 6 does not contain a first cladding layer facing the epitaxial growth substrate 1. In this exemplary embodiment, the first waveguide layer 9 is thus applied directly to the buffer layer sequence 2 and only the second waveguide layer 10 disposed above the active layer 4 as seen from the epitaxial growth substrate adjoins a second cladding layer 8. In an advantageous manner, the first cladding layer can be obviated if the epitaxial growth substrate 1 of $Al_{1-x}(In_yGa_{1-y})_xN$ or $In_{1-x}Ga_xN$, where $0<x<0.99$ and $0≤y≤1$ and/or the buffer layer sequence 2, which advantageously contains several layers of $In_yAl_{1-x}Ga_xN$, where $x<0.9$ and $y<0.1$, have, owing to their aluminium content, a comparatively low refractive index which is already sufficient to optically guide the laser radiation in the waveguide formed from the active layer 4, the first waveguide layer 9 and the second waveguide layer 10. By obviating the cladding layer facing the epitaxial growth substrate 1, the production cost is advantageously reduced. Furthermore, the layer thickness of the epitaxial layer sequence 6 is reduced, whereby the heat dissipation of the heat, generated by the active layer 4, to the epitaxial growth substrate 1 is improved.

Figure 5:
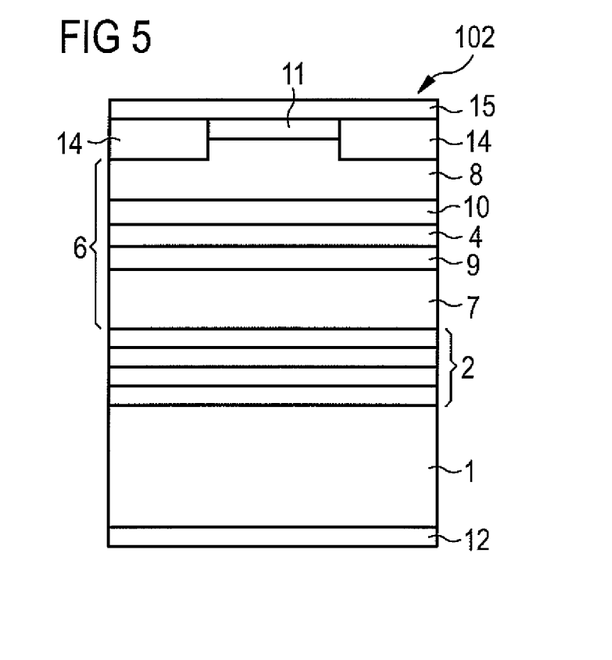
FIG. 5 shows a schematic illustration of a cross-section through an optoelectronic component according to a fifth exemplary embodiment of the invention.

The optoelectronic component in the exemplary embodiment illustrated in FIG. 5 is a ridge waveguide laser 102. The layer sequence of the ridge waveguide laser 102 substantially corresponds to the exemplary embodiment of an edge-emitting semiconductor laser illustrated in FIG. 3. The ridge waveguide laser 102 differs from the edge-emitting semiconductor laser illustrated in FIG. 3 by virtue of the fact that a ridge for forming a ridge waveguide is produced in the upper cladding layer 8 and the p-contact layer 11. The ridge can be produced for example by means of an etching process in which parts of the p-contact layer 11 and the cladding layer 8 are removed so that only a strip-like region remains. The exposed regions of the cladding layer 8 and the p-contact layer 11 are each provided with passivation layers 14. A contact metallisation 15 can also be applied to the p-contact layer 11, wherein the regions of the cladding layer 8 disposed outside the central ridge are insulated from the contact metallisation 15 by the passivation layers 14. This type of structuring and contacting arrangement ensures that the laser emission in the active layer 4 is limited to a central strip-like region.

The n-side contacting of the ridge waveguide laser 102 is effected for example by an n-contact layer 12 which can be disposed on the rear side of the epitaxial growth substrate 1 remote from the active layer 4. In the case of a non-conductive epitaxial growth substrate 1, the contact layer 12 can also be guided as a through-connection through the epitaxial growth substrate to the n-doped layers, e.g., the buffer layers 2.

Figure 6:
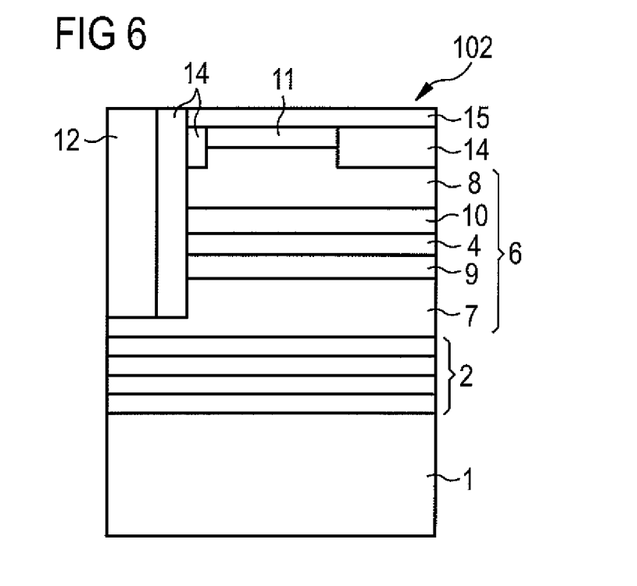
FIG. 6 shows a schematic illustration of a cross-section through an optoelectronic component according to a sixth exemplary embodiment of the invention.

FIG. 6 shows a further exemplary embodiment of a ridge waveguide laser 102 which differs from the exemplary embodiment illustrated in FIG. 5 by the way of producing the n-contact. In the ridge waveguide laser 102 illustrated in FIG. 6, the contacting arrangement is achieved in a similar manner to the LED illustrated in FIG. 2. The epitaxial layer sequence 6 is etched down in a boundary region of the ridge waveguide laser 102 to the region of the n-doped semiconductor layers 7, 9 so that these can be contacted with an n-contact layer 12. The active layer 4 and the p-doped semiconductor layers 10, 8 are in this case electrically insulated from the n-contact layer 12 by means of a passivation layer 14. This type of electrical contacting arrangement is particularly advantageous when the epitaxial growth substrate 1 is electrically non-conductive.

Figure 7:
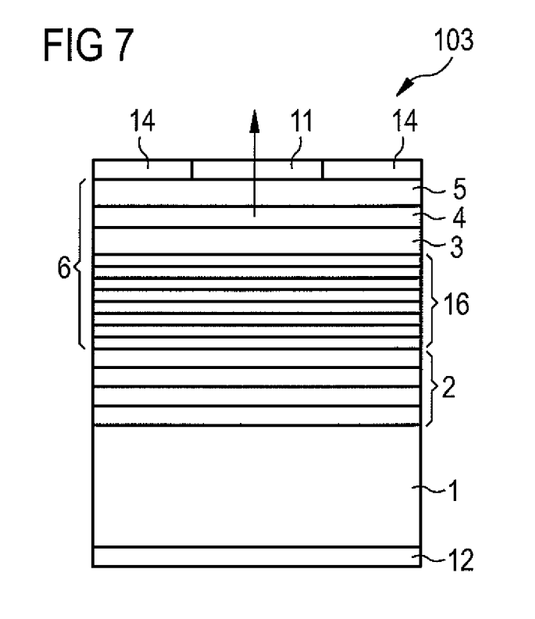
FIG. 7 shows a schematic illustration of a cross-section through an optoelectronic component according to a seventh exemplary embodiment of the invention.

The optoelectronic component in the exemplary embodiment illustrated in FIG. 7 is an LED having a resonant cavity (RCLED) 103. The RCLED 103 comprises, like the previously described exemplary embodiments, an epitaxial growth substrate of $Al_{1-x}(In_yGa_{1-y})_xN$ or $In_{1-x}Ga_xN$, where $0<x<0.99$ and $0≤y≤1$. Several buffer layers 2 of $In_yAl_xGa_{1-x-y}N$, where $x<0.9$ and $y<0.1$ are applied to the epitaxial growth substrate 1. An epitaxial layer sequence 6, which contains a Distributed Bragg Reflector 16, is applied to the buffer layers 2. The Distributed Bragg Reflector 16 contains a plurality of layer pairs consisting of first layers and second layers which differ from each other in terms of their material composition and thus their refractive index.

The layer pairs preferably contain first layers of $In_{y1}Al_{x1}Ga_{1-x1-y1}$ and second layers of $In_{y2}Al_{x2}Ga_{1-x2-y2}$, wherein for the aluminium content, in an advantageous manner, $x1>0.01$ and $x2>0.05$, where $x1 \neq x2$. By virtue of the fact that the layer pairs of the Distributed Bragg Reflector 16 having a comparatively high aluminium content can be grown on the epitaxial growth substrate 1 and the buffer layer sequence 2 applied thereto, it is possible to achieve a higher refractive index contrast between the first and second layers of the Distributed Bragg Reflector 16 which means that the number of layer pairs can be reduced in comparison with a conventional Distributed Bragg Reflector with the same reflectivity. In this manner, the layer thickness of the epitaxial layer sequence 6 is advantageously reduced which has a positive effect on the heat dissipation of the heat generated by the active layer 4.

Furthermore, it is advantageous for the heat dissipation of the heat generated by the active layer 4 that the epitaxial growth substrate of $Al_{1-x}(In_yGa_{1-y})_xN$ or $In_{1-x}Ga_xN$, where $0<x<0.99$ and $0≤y≤1$, has a comparatively efficient heat conductivity in comparison with substrates conventionally used for the epitaxial growth of nitride compound semiconductors, such as sapphire or GaN.

The semiconductor layers of the Distributed Bragg Reflector 16 are preferably n-doped. Following the Distributed Bragg Reflector 16 are at least one region of n-doped semiconductor layers 3, the active layer 4 and at least one region of p-doped semiconductor layers 5. Applied to the p-doped region 5 is a p-contact layer 11 which reflects back a part of the radiation 13 emitted by the active layer 4 and thus forms with the Distributed Bragg Reflector 16 a cavity. In this manner, the RCLED 103 is able to emit radiation 13 at high intensity in a preferential direction perpendicular to the active layer 4. In order to achieve a small beam cross-section, the partially reflective p-contact layer 12 is applied only to a central partial region of the p-doped region 5, wherein the laterally adjoining regions are preferably provided with a passivation layer 14.

Figure 8:
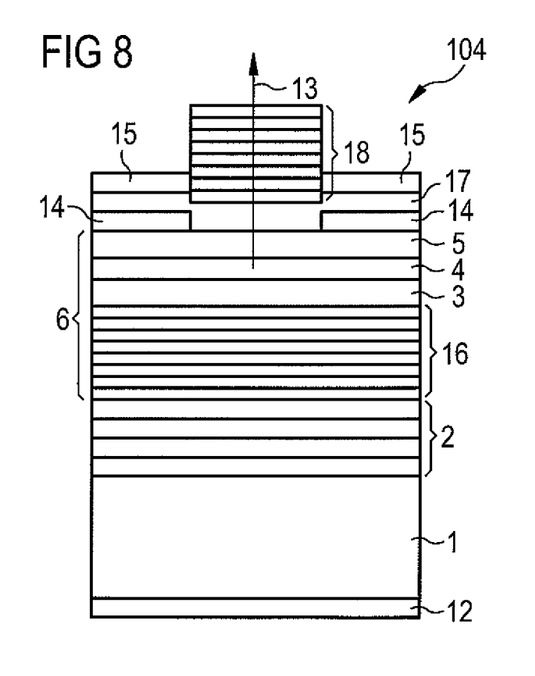
FIG. 8 shows a schematic illustration of a cross-section through an optoelectronic component according to an eighth exemplary embodiment of the invention.

The advantages of the epitaxial growth substrate 1 and of the Distributed Bragg Reflector 16 applied thereto as described with reference to the exemplary embodiment illustrated in FIG. 7 also apply to the optoelectronic component which is illustrated in FIG. 8 and which is a surface-emitting semiconductor laser having a vertical resonator (VCSEL) 104. In the case of the surface-emitting semiconductor laser 104, the Distributed Bragg Reflector 16 forms the first resonator reflector for the laser radiation 13. The second resonator reflector of the surface-emitting semiconductor laser is formed by a second Distributed Bragg Reflector 18 which as seen from the active layer 4 lies opposite the first Distributed Bragg Reflector 16. In contrast to the first Distributed Bragg Reflector 16 which is preferably formed from alternating n-doped semiconductor layers, the second Distributed Bragg Reflector 18 is formed by alternating dielectric layers. The second Distributed Bragg Reflector 18 is applied to a transparent contact layer 17 which is used for electrically contacting the surface-emitting semiconductor laser 104. The transparent contact layer 17 adjoins the p-doped region 5 in a central region of the surface-emitting semiconductor laser 104. In order to restrict the current flow and thus also the generation of laser radiation 13 to a central region of the surface-emitting semiconductor laser 104, the transparent contact layer 17 is insulated from the epitaxial layer sequence in the boundary regions of the surface-emitting semiconductor laser by means of passivation layers 14. At the side of the Distributed Bragg Reflector 18, the transparent contact layer can be provided with contact metallizations 15. The radiation 13 which is generated by the surface-emitting semiconductor laser 104 is coupled out through the second Distributed Bragg Reflector 18. The surface-emitting semiconductor laser 104 is electrically contacted on the one hand by the transparent contact layer 17 in conjunction with the contact metallizations 15 and on the other hand e.g. by an n-contact layer 12 which is applied to the rear side of the epitaxial growth substrate. Alternatively, the n-doped side of the surface-emitting semiconductor laser 104 can also be electrically contacted in the same way as in the case of the ridge waveguide laser illustrated in FIG. 6. In the case of a non-conductive epitaxial growth substrate 1, the n-contact layer 12 can alternatively also be connected in an electrically conductive manner to the n-doped semiconductor layers of the surface-emitting semiconductor laser 104 by means of through-connection through the epitaxial growth substrate 1.

In FIGS. 9a to 9e an exemplary embodiment of the method in accordance with the invention is explained in more detail with reference to intermediate steps.

Figure 9A:
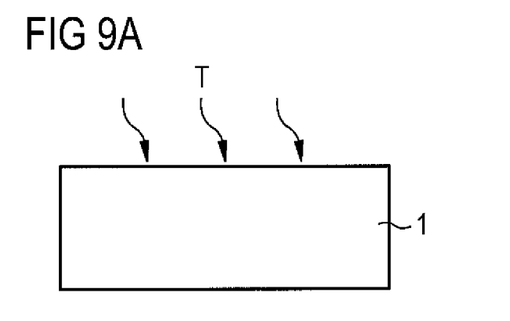
FIG. 9 shows a schematic illustration of an exemplary embodiment of a method according to the invention with reference to intermediate steps.

In the case of the intermediate step illustrated in FIG. 9a, an epitaxial growth substrate of $Al_{1-x}(In_yGa_{1-y})_xN$ or $In_{1-x}Ga_xN$, where $0<x<0.99$ and $0\leq y\leq 1$, is provided, onto which the epitaxial layer sequence of an optoelectronic component is to be grown. The epitaxial growth substrate 1 is subjected to heat treatment at a temperature T of preferably more than 1000° C., e.g., between 1000° C. and 1100° C., in an advantageous manner in situ, i.e., in the coating chamber provided for the epitaxial growth of the epitaxial layer sequence. The heat treatment preferably takes place with the supply of $H_2$ or $NH_3$ gas and serves to remove impurities which contain carbon and/or oxygen from the surface of the epitaxial growth substrate 1.

Figure 9B:
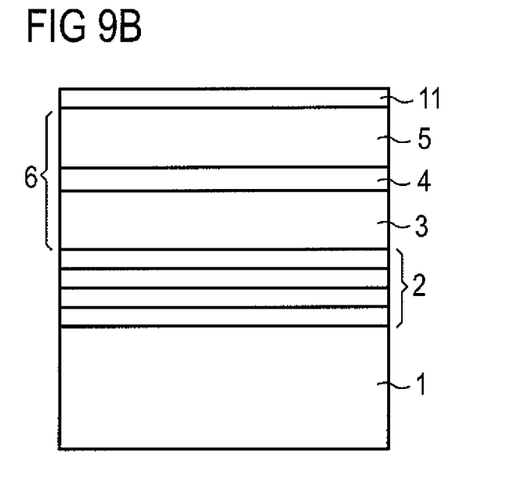

In the case of the intermediate step illustrated in FIG. 9b, a semiconductor layer sequence has been grown onto the epitaxial growth substrate 1 which has been pretreated in this manner. A buffer layer sequence 2 which contains several layers of $In_yAl_{1-x}Ga_xN$, where x<0.9 and y<0.1, has been grown directly onto the epitaxial growth substrate 1. An epitaxial layer sequence 6 of the optoelectronic component which contains at least one n-doped semiconductor layer 3, the active layer 4 and at least one p-doped semiconductor layer 5 is grown onto the buffer layers 2. A p-contact layer 11 is applied to the at least one p-doped semiconductor layer 5. The epitaxial layer sequence 6 thus corresponds to the exemplary embodiment of an LED illustrated in FIG. 1.

Figure 9C:
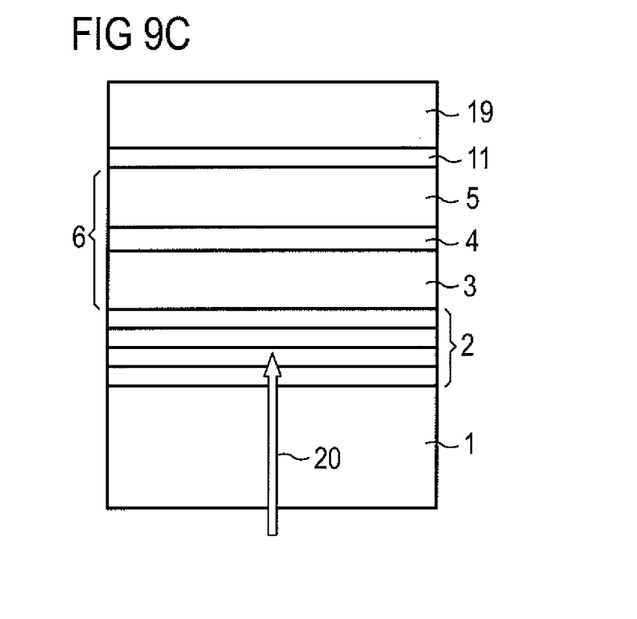

In the case of the intermediate step of the method as illustrated in FIG. 9c, a support 19 has been applied to the p-contact layer 11. The support 19 is preferably electrically conductive, so that in an advantageous manner an electrical contact can be established for the optoelectronic component, which is produced by the method, via the support 19.

Figure 9D:
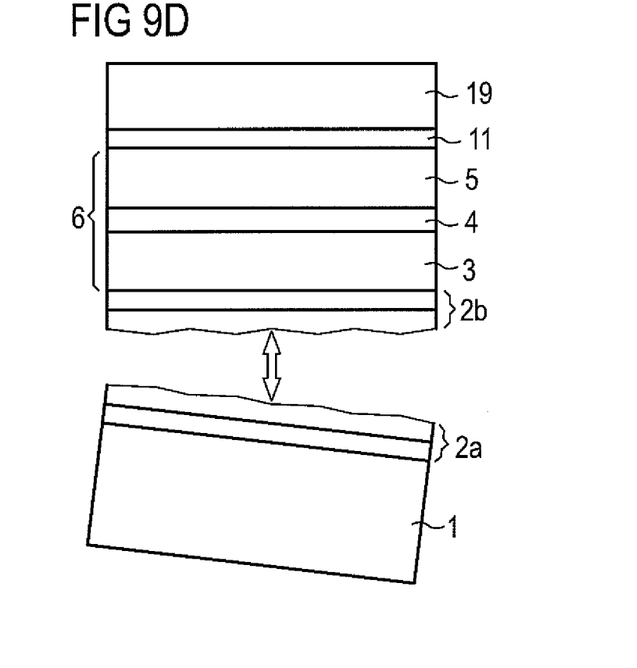

The epitaxial growth substrate 1 is subsequently cut off by a laser lift off method. Laser radiation 20 is radiated through the epitaxial growth substrate 1 into the previously applied semiconductor layers. This exploits the fact that the epitaxial growth substrate 1 of $Al_{1-x}(In_yGa_{1-y})_xN$ or $In_{1-x}Ga_xN$, where $0<x<0.99$ and $0\leq y\leq 1$, is advantageously transparent for laser radiation which is absorbed by the semiconductor layers. The laser radiation 20 is preferably absorbed in the region of the buffer layer sequence 2, wherein the absorption of the laser radiation 20 results in the semiconductor material being decomposed such that the semiconductor body is cut through in this region, as schematically illustrated in FIG. 9d. After the semiconductor body has been cut through by means of the laser lift off method, the epitaxial growth substrate 1, possibly with the remnants of the buffer layer sequence 2a, and the epitaxial layer sequence 6 on the support 19 are separated from one another.

The remnants of the buffer layer sequence 2a, 2b which remain on the separated halves of the semiconductor body can be removed from the epitaxial growth substrate 1 or the epitaxial layer sequence 6, e.g., by means of an etching process. In particular, this has the advantage that the epitaxial growth substrate 1 can be recycled for the epitaxial growth of further semiconductor layer sequences.

Figure 9E:
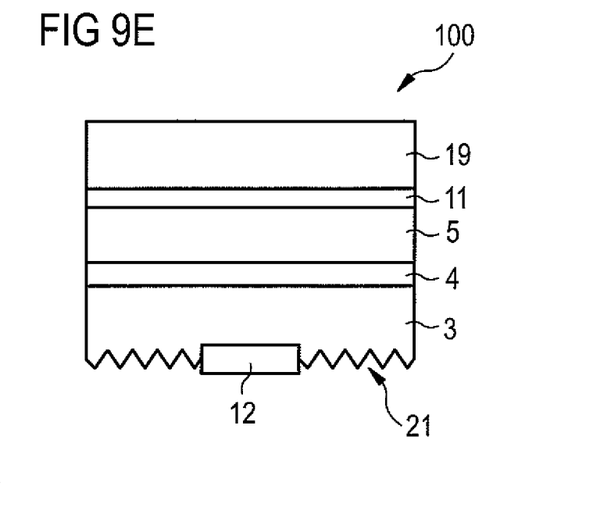

The optoelectronic component is completed in the following method steps with the part of the separated semiconductor body which contains the support 19 and the epitaxial layer sequence 6. As illustrated in FIG. 9e, the n-doped region 3 of the epitaxial layer sequence 6, which region is freed of the remnants of the buffer layer sequence, is preferably provided with structuring 21 which serves to improve the coupling out of radiation from the optoelectronic component. For example, the surface, of the n-doped region 3 which is opposite the support 19 and which in the case of the optoelectronic component serves to couple out the radiation is roughened in such a manner as to reduce the portion of radiation which is emitted by the active layer 4 and is totally reflected at the interface between the n-doped region 3 and the surrounding medium.

Furthermore, at least one partial region of the surface of the n-doped region 3 is provided with an n-contact layer 12 in order to complete the optoelectronic component which is an LED 100.

Figure 10:
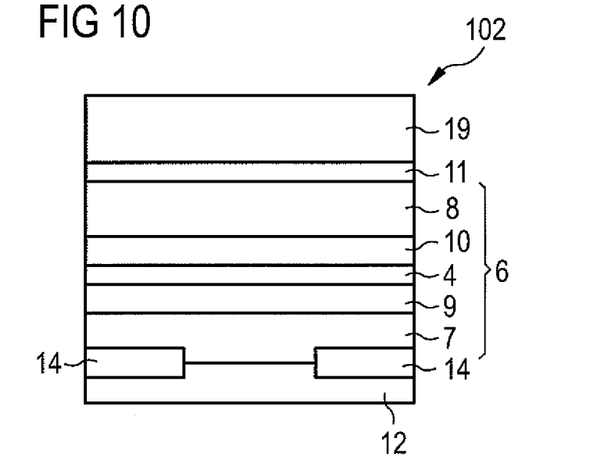
FIG. 10 shows an exemplary embodiment of an optoelectronic component produced using the method according to the invention.
Figure 11:
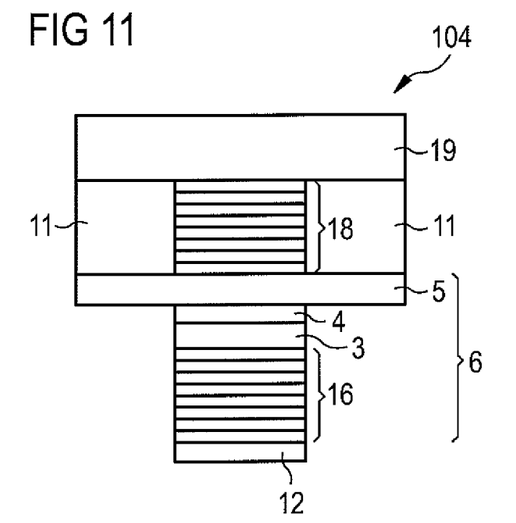
FIG. 11 shows a further exemplary embodiment of an optoelectronic component produced using the method according to the invention.
Figure 12:
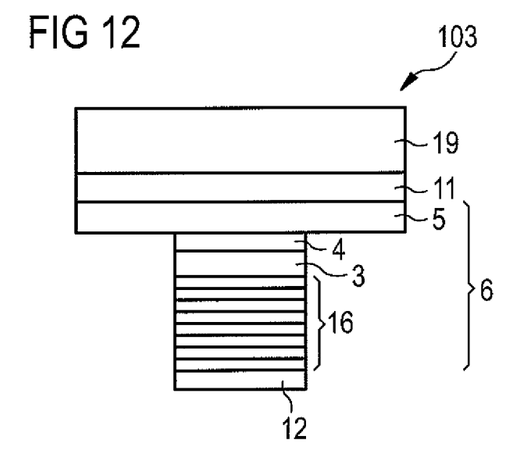
FIG. 12 shows a further exemplary embodiment of an optoelectronic component produced using the method according to the invention.

FIGS. 10, 11 and 12 illustrate three further exemplary embodiments of optoelectronic components which are produced by the method in accordance with the invention. A common aspect of these exemplary embodiments is that the epitaxial layer sequence contained in these optoelectronic components has been grown in each case on an epitaxial growth substrate of $Al_{1-x}(In_yGa_{1-y})_xN$ or $In_{1-x}Ga_xN$, where $0<x<0.99$ and $0\leq y\leq 1$, which has been separated from the epitaxial layer sequence after the epitaxial layer sequence has been connected to a support on the side opposite the epitaxial growth substrate. These method steps correspond to the method steps explained in connection with FIGS. 9a to 9d and will therefore not be explained in greater detail hereinafter.

However, the optoelectronic components illustrated in FIGS. 10, 11 and 12 differ from the exemplary embodiment illustrated in FIG. 9e in terms of the type of epitaxial layer sequence 6, and differ in terms of the type of structuring of the n-doped semiconductor layers which have become accessible as a result of the separation of the epitaxial growth substrate. These differences with respect to the LED 100 illustrated in FIG. 9e will be explained in greater detail hereinafter.

The optoelectronic component illustrated in FIG. 10 is a ridge waveguide laser 102. The epitaxial layer sequence 6 of the ridge waveguide laser 102 corresponds substantially to the exemplary embodiment illustrated in FIG. 5, i.e., it contains an n-doped first cladding layer 7, an n-doped first waveguide layer 9, the active layer 4, a second p-doped waveguide layer 10 and a second p-doped cladding layer 8. In contrast to the exemplary embodiment illustrated in FIG. 5, the ridge waveguide of the ridge waveguide laser 102 has not been generated in the p-doped cladding layer 8, but rather in the n-doped cladding layer 7 which is accessible for structuring after separation of the epitaxial growth substrate. The n-doped cladding layer 7 has been structured to form a ridge waveguide, e.g., by means of an etching process, wherein the regions laterally adjoining the ridge waveguide are each provided with passivation layers 14. An n-contact layer 12 is applied to the ridge waveguide which is provided with the passivation layers 14. The p-side contacting of the stripe laser 102 is effected by a p-contact layer 11 which is applied to the p-doped cladding layer 8. The electrically conductive support 19 is disposed on the p-contact layer 11.

The generation of the ridge waveguide in the n-doped cladding layer 7 has the advantage that the risk of degradation of the electrical properties is reduced, as it has been found that in comparison with p-doped layers n-doped layers are less sensitive in terms of their electrical properties than etching processes, in particular plasma processes.

FIG. 11 illustrates an exemplary embodiment of an optoelectronic component in the form of a surface-emitting semiconductor laser 104 having a vertical resonator (VCSEL), in which the epitaxial layer sequence 6 has been grown on an epitaxial growth substrate of $Al_{1-x}(In_yGa_{1-y})_xN$ or $In_{1-x}Ga_xN$, where $0<x<0.99$ and $0\leq y\leq 1$, which has been cut off from the epitaxial layer sequence 6, so that the region of the n-doped semiconductor layers is accessible for structuring.

The epitaxial layer sequence 6 of the surface-emitting semiconductor laser 104 comprises at least one p-doped region 5, the active layer 4, an n-doped region 3 and an n-doped Distributed Bragg Reflector 16. The n-doped semiconductor layers 3, 16 and the active layer 4 have been structured to form a mesa. A Distributed Bragg Reflector 18 which is preferably formed from dielectric layers is applied to the unstructured p-doped region 5 on the side remote from the active layer 4. The n-doped Distributed Bragg Reflector 16 and the dielectric Distributed Bragg Reflector 18 form the laser resonator of the surface-emitting semiconductor laser 104.

The Distributed Bragg Reflector 18 is preferably structured such that it has the same extent as the mesa which is formed by the active layer 4, the n-doped region 3 and the Distributed Bragg Reflector 16. The dielectric Distributed Bragg Reflector 18 is structured, e.g., prior to separation of the epitaxial growth substrate, before the semiconductor body is connected to the support 19. The electrical contacting of the surface-emitting semiconductor laser 104 is effected by p-contact layers 11 which are disposed at the side of the Distributed Bragg Reflector 18 and adjoin the p-doped region 5. An n-contact layer 12 is applied to the Distributed Bragg Reflector 16. The n-contact layer 12 is preferably a transparent contact layer, in particular consisting of electrically conductive transparent oxide such as, e.g., ITO or ZnO, or it comprises a preferably circular orifice for coupling out the radiation emitted by the surface-emitting semiconductor laser 104. The support 19 is disposed on the Distributed Bragg Reflector 18 and the p-contact layers 11 disposed at the side thereof.

The optoelectronic component which is illustrated in FIG. 12 and has been produced by a method in accordance with the invention is an LED having a resonant cavity (RCLED) 103. The RCLED 103, like the VCSEL illustrated in FIG. 11, comprises a mesa structure which comprises the active layer 4, an n-doped region 3 and an n-doped Distributed Bragg Reflector 16. The RCLED 103 likewise comprises at least one p-doped region 5. In contrast to VCSEL described in the exemplary embodiment above, the RCLED 103 does not comprise a further Distributed Bragg Reflector on the p-doped region 5 but rather merely a partially reflective p-contact layer 11. On the reflective p-contact layer 11, the RCLED 103 is connected to a conductive support 19. A second electrical contact of the RCLED 103 is accomplished by virtue of the fact that an n-contact layer 12 is applied to the n-doped Distributed Bragg Reflector 16.

The description made with reference to the exemplary embodiments does not restrict the invention. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic component comprising:
   an epitaxial layer based on a nitride compound semiconductor, the epitaxial layer sequence having an active layer;
   an epitaxial growth substrate of $Al_{1-x}(In_yGa_{1-y})_xN$ or $In_{1-x}Ga_xN$, where $0<x<0.99$ and $0\leq y\leq 1$; and
   multiple buffer layers of $In_yAl_xGa_{1-x-y}N$, where $x<0.9$ and $y<0.1$, applied on the epitaxial growth substrate,
   wherein the epitaxial layer sequence comprises a Distributed Bragg Reflector comprising multiple layer pairs, each pair containing a first layer of $In_{y1}Al_{x1}Ga_{1-x1-y1}N$ and a second layer of $In_{y2}Al_{x2}Ga_{1-x2-y2}N$, wherein $x1>0.01$ and $x2>0.05$ applies for the aluminum content.

2. The optoelectronic component according to claim 1, wherein the epitaxial growth substrate comprises a defect density of less than $10^7$ cm$^{-2}$.

3. An optoelectronic component comprising:
   an epitaxial layer sequence based on a nitride compound semiconductor, the epitaxial layer sequence having an active layer;

first and second waveguide layers, wherein the active layer is between the first and second waveguide layers;
a cladding layer; and
an epitaxial growth substrate of $Al_{1-x}(In_yGa_{1-y})_xN$ or $In_{1-x}Ga_xN$, where $0<x<0.99$ and $0\leq y\leq 1$;
wherein:
the optoelectronic component is an edge-emitting semiconductor laser;
the second waveguide layer, as seen from the active layer, is opposite the epitaxial growth substrate and is followed by the cladding layer; and
no cladding layer is disposed between the epitaxial growth substrate and the waveguide layer facing the epitaxial growth substrate.

4. The component according to claim 3, further comprising multiple buffer layers of $In_yAl_xGa_{1-x-y}N$, where $x<0.9$ and $y<0.1$, applied on the epitaxial growth substrate.

* * * * *